US007027637B2

(12) United States Patent
Fang et al.

(10) Patent No.: US 7,027,637 B2
(45) Date of Patent: Apr. 11, 2006

(54) ADAPTIVE THRESHOLD DETERMINATION FOR BALL GRID ARRAY COMPONENT MODELING

(75) Inventors: Tong Fang, Old Bridge, NJ (US); Ming Fang, Princeton Jct., NJ (US)

(73) Assignee: Siemens Corporate Research, Inc., Princeton, NJ (US)

( * ) Notice: Subject to any disclaimer, the term of this patent is extended or adjusted under 35 U.S.C. 154(b) by 598 days.

(21) Appl. No.: 10/080,805

(22) Filed: Feb. 21, 2002

(65) Prior Publication Data

US 2003/0156748 A1    Aug. 21, 2003

(51) Int. Cl.
*G06K 9/00* (2006.01)

(52) U.S. Cl. .............. 382/145; 382/146; 382/168; 382/170; 382/171; 382/172; 382/192; 382/195; 382/270; 382/271; 382/272; 382/273; 382/204; 348/86; 348/125; 250/559.47

(58) Field of Classification Search .......... 382/145, 382/146, 141, 168, 170, 171, 172, 192, 195, 382/270, 271, 272, 273, 204, 150; 250/559.47; 348/96, 86, 92, 125
See application file for complete search history.

(56) References Cited

U.S. PATENT DOCUMENTS

| 4,696,047 A | * | 9/1987 | Christian et al. ........... 382/146 |
| 5,832,111 A | * | 11/1998 | Florent ...................... 382/171 |
| 5,936,665 A | * | 8/1999 | Vachtsevanos et al. ....... 348/91 |
| 6,614,926 B1 | * | 9/2003 | Fix et al. .................... 382/150 |

FOREIGN PATENT DOCUMENTS

EP    0149685 A1  *  7/1985

\* cited by examiner

*Primary Examiner*—Bhavesh M. Mehta
*Assistant Examiner*—John Strege
(74) *Attorney, Agent, or Firm*—Donald B. Paschburg; E. Chau & Associates, LLC (57) ABSTRACT

A method for determining a number of balls in a projection space comprises determining a projection of a portion of a ball grid array, determining at least one local maximum of the projection space for a given threshold, and determining at least a distance between adjacent maximum. The method further comprises determining an inter-peak histogram of the distances, determining an inter-ball distance for each pair of adjacent balls that has the maximum value of the inter-peak distance histogram corresponding to the pair of adjacent balls, and determining a position of a first ball and a position of a last ball. The method comprises verifying the position of the first ball and the position of the last ball based on a general inter-ball distance, and determining the number of balls.

16 Claims, 7 Drawing Sheets

ADAPTIVE THRESHOLD DETERMINATION FOR BALL GRID ARRAY COMPONENT MODELING

BACKGROUND OF THE INVENTION

1. Field of the Invention

The present invention relates to machine vision, and more particularly, to a method for detecting circles in images taken under various lighting conditions.

2. Discussion of Related Art

Detecting a circle in an image is a basic task needed for computer vision, for example, in Surface Mounted Device (SMD) inspection applications. Typically, a Hough transform is used for computerized circle and curve detection. The principle of the Hough transform is to detect parameterized curves by mapping image edge pixels into manifolds in a parameter space and finding peaks using a multidimensional histogram procedure. This method, however, is expensive in terms of computation and memory needs. Typically, due to memory storage limitations, this method also has discretization error in both the image and the parameter space.

Several methods have been proposed to improve Hough transform techniques in terms of efficiency, accuracy and memory storage. One modified scheme uses gradient orientation from edge points. A probabilistic Hough transform attempts to reduce redundant information by sampling image data in various ways. A randomized Hough transform is proposed to detect a curve with n parameters by randomly picking n pixels and mapping them into one point in the parameter space, instead of transforming one pixel into a hyperplane in n-dimensional parameter space. Other methods, such as a generalization Hough transform and a decomposed Hough transform, have been proposed to improve Hough transform techniques. However, the above-mentioned methods are Hough transformation based and are therefore, generally slow.

No known system or method exists for detecting circles in various illumination conditions. Therefore, a need exists for an adaptive method for determining suitable threshold values for various illuminations.

SUMMARY OF THE INVENTION

According to an embodiment of the present invention, a method is provided for determining a number of objects. The method comprises determining a projection space including the objects, wherein a distance between two adjacent objects is substantially the same for each pair of adjacent objects, and determining an adaptive threshold according to a number of objects determined to be in the projection space. The method further comprises determining an inter-object distance according to an average inter-peak distance at the adaptive threshold, and determining a number of objects in the projection space according to the inter-object distance.

According to an embodiment of the present invention, a method is provided for determining a number of balls in a projection space. The method comprises determining a projection of a portion of a ball grid array, determining at least one local maximum of the projection space for a given threshold, and determining at least a distance between adjacent maximum. The method further comprises determining an inter-peak histogram of the distances, determining an inter-ball distance for each pair of adjacent balls that has the maximum value of the inter-peak distance histogram corresponding to the pair of adjacent balls, and determining a position of a first ball and a position of a last ball. The method comprises verifying the position of the first ball and the position of the last ball based on a general inter-ball distance, and determining the number of balls.

Determining a projection further comprises projecting a row/column of ball image a direction, wherein the direction is one of horizontally and vertically.

The inter-peak distance bin width is a tolerance of the general inter-ball distance.

The number of balls is determined according to:

$$N = \frac{\text{distance between the first and the last ball}}{\text{inter-ball distance}} + 1$$

where N is the number of balls and the inter-ball distance is determined according to a maximum value of the inter-peak distance histogram.

The given threshold is determined. Determining the threshold comprises determining the number of balls in the projection space for one or more given threshold values in a threshold searching range based on the general inter-ball distance of ball grid array components. The method further comprises determining a histogram for the number of balls, determining a threshold range comprising a plurality of threshold values, wherein each threshold value corresponds to a maximum number of balls at the threshold value, and setting the threshold to one of a mean threshold value and a median threshold value of the threshold range.

The histogram shows a maximum frequency of the number of balls.

The general inter-ball distance is an average of the distances between each pair of adjacent balls.

According to an embodiment of the present invention, a program storage device is provided, readable by machine, tangibly embodying a program of instructions executable by the machine to perform method steps for determining a number of balls in a projection space.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The generation of a Ball Grid Array (BGA) is a task that can be used for image processing and machine vision tasks for Pick-and-Place applications. According to an embodiment of the present invention, a method can generate a model for BGA components, and localize and inspect the model with corresponding BGA models. A BGA model can include, for example, ball diameter, number of balls and distances between the balls in both directions (e.g., horizontal and vertical), etc.

Figure 1:
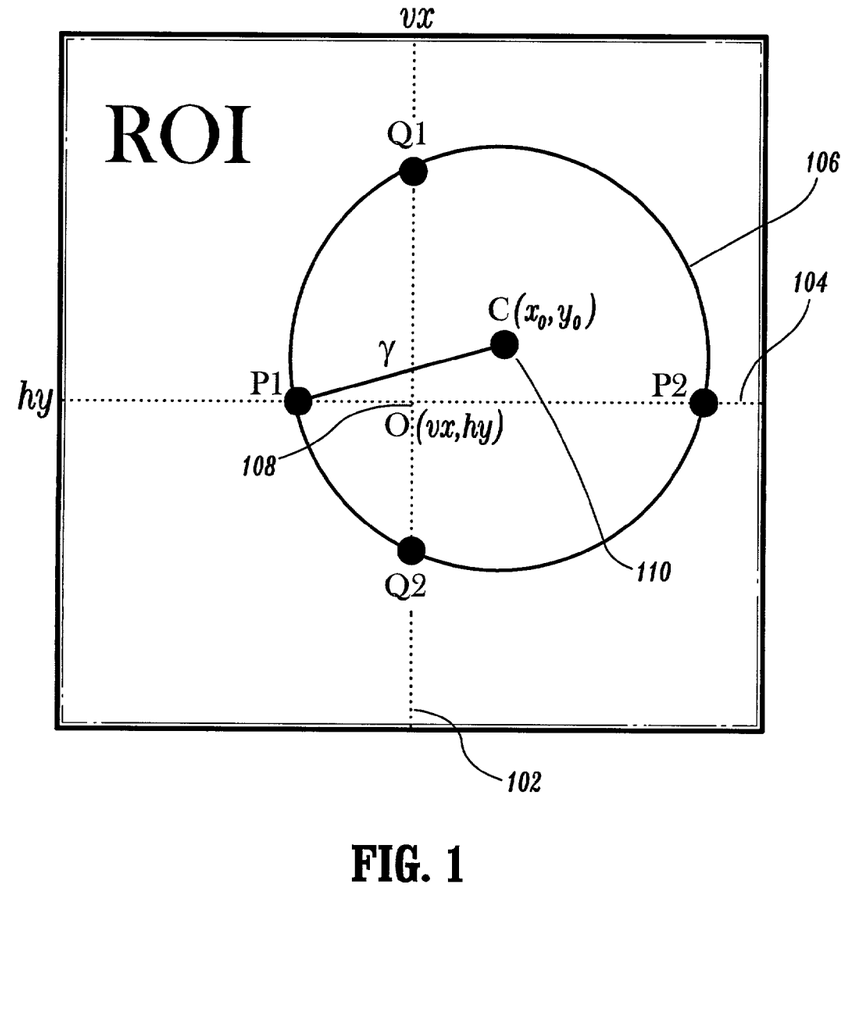
FIG. 1 is a diagram of a region of interest having a circle with parameters according to one embodiment of the present invention.

According to the geometric properties of a circle, a line that intersects the center point of a segment connecting two edge points on a circle, perpendicular to the segment, will also intersect the center of the circle. Referring to FIG. 1, the circle to be detected 106 is scanned horizontally and vertically through the center of an image 108 or a region of interest (ROI), O(hx, vy). The coordinates for the center of the circle 110, $(x_0, y_0)$, can be obtained from the center of horizontal segment and vertical segment as shown in FIG. 1.

In FIG. 1, edge points $P1(x_1, h_y)$, $P2(x_2, h_y)$ are end points of a horizontal segment and the edge points $Q1(v_x, y_1)$, $Q2(v_x, y_2)$ are end points of a vertical segment. The following results can be obtained:

$$x_0 = x_1 + \frac{x_2 - x_1}{2} \quad (1)$$

$$y_0 = y_1 + \frac{y_2 - y_1}{2} \quad (2)$$

$$\gamma = \sqrt{\left(\frac{|P_1 P_2|}{2}\right)^2 + (y_0 - hy)^2} = \sqrt{\left(\frac{|Q_1 Q_2|}{2}\right)^2 + (x_0 - vx)^2} \quad (3)$$

Where $(x_0, y_0)$ are the coordinates for the center 110 of the detected circle 106 and r is the radius of the detected circle 106.

The circle 106 to be detected is assumed to be within the ROI. Further, the ROI center 108, O(hx, vy), is assumed to be located inside the circle 106. In some cases, it can be difficult to select a ROI to exclude other structures located inside or near the circle in real applications. Typically, ROI's are rectangular, though other shapes are possible. In this case, a rectangular ROI is used. The ROI is selected to reduce the presence of foreign structures to increase the efficiency and robustness of a BGA modeling method. The ROI can be selected manually.

Edge points P1 and P2 can be extracted by scanning the image horizontally at the position of row hy 104 and conducting a horizontal gradient operation. Similarly, edge points Q1 and Q2 can be extracted by vertical scanning at the position of column vx 102, and conducting a vertical gradient operation. Then by using Equations (1) through (3), the circle parameters can be obtained.

Figure 2:
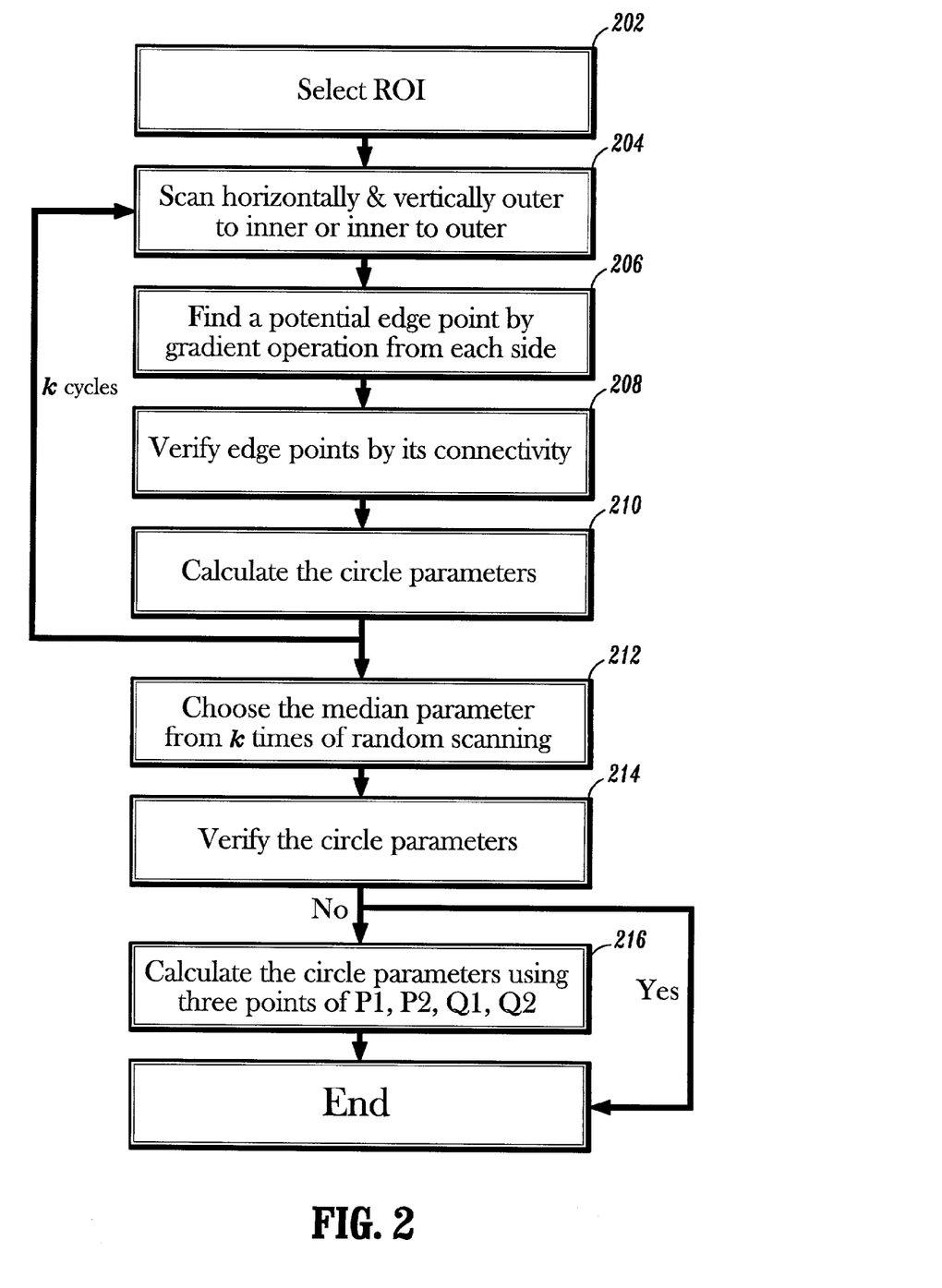
FIG. 2 is a flow chart of a method of circle detection and verification according to another embodiment of the present invention.

A method for fast dominant circle detection uses horizontal and vertical scanning through the center of an image or a region of interest (ROI), O(hx, vy). The coordinates for the center of the circle, $(x_0, y_0)$, can be obtained from the center of horizontal segment and vertical segment. A horizontal and vertical scans 204 are conducted and result in a pixel array.

A gradient operation is performed along the horizontal and vertical plains (pixel array), e.g., the x and y-axis of the ROI. An edge point is the local maximum in a gradient array. The potential edge points are determined 206 for the circle by searching the gradient arrays for local maximums. A connectivity verification procedure 208 can be performed to find the true edge points of the circle. The method obtains circle radiuses $r_1$ and $r_2$ 210, calculated from edge points. Given a number of scanning times, k 212, the method randomly scans the image within a row and column range and determines a center $x_0$ 212. The method chooses the median value to be the candidate center $x_0$ 212. The method can verify whether the two radiuses $r_1$ and $r_2$ are equal 214, and thus, verify the edge points. If one of the four edge points is not detected accurately, the other three edge points can still be used to determine the correct circle parameters 216.

Vertical scanning is similar to the horizontal scanning, and involves similar techniques. Given a ROI (202) m×n for circle detection, where m and n are the size of the rows and columns in the ROI respectively, a horizontal scan 204 can be conducted at the position of row hy and results in a pixel array $A_{hy}(i)$, where $i \in [1,n]$. Then a gradient operation along the horizontal plain is performed to obtain a gradient array $G_{hy}(i)$, where:

$$G_{hy}(i) = |A_{hy}(i) - A_{hy}(i-1)| \quad (4)$$

In general, an edge point, or feature point, is the local maximum in a gradient array. If the background is clean, substantially without noise, and no structure is located outside the circle, the first local maximum is the left edge point 206 of the circle when searching for the gradient array from left to right. Similarly, the first local maximum is the right edge point 206 when we search from right to left. However, if noise, e.g., speckle noise, exists in the background, the first local maximum may be a noise point. Therefore, a connectivity verification procedure 208 can be performed to find the real edge points of a circle.

Each edge point of a circle has at least two adjacent or connected edge points. By checking the neighborhood feature points of the first local maximum, isolated noise points, or pairs of noise points, can be eliminated from the candidate edge points of a circle. For low noise background, a 3×3 window can be implemented for neighborhood connectivity verification. For high noise background, a 5×5 or 7×7 window can be implemented. While the window size does not change, the size of columns and rows will decrease as the number of columns and rows increases (assuming the size of each column and row is equal to every other column and row respectively). Therefore, by increasing the number of columns and rows, the method decreases the likelihood that noise will be found in any one column or row during scanning.

It is also possible that some foreign structures are located inside or outside the circle. If the structures are only located inside or outside the circle, then the method can detect the circle by conducting outer to inner scanning or inner to outer scanning, respectively. For example, if all foreign structures are located outside the circle, by searching for the local maximum from inner circle to outer circle, the first local maximum with connectivity will be an edge point.

However, if foreign structures are located inside and outside the circle simultaneously, the method performs random scanning around the center of ROI. For horizontal scanning, given the number of scanning times k 212, the method randomly scans the image within the row range of [hy−δ, hy+δ] with δ≦m/4. For each scanning array, the method extracts the left and right edge points. The center $x_0$ is calculated using Equation (1). The center $x_0$ can be written to a new array X. The method can sort the array and choose the median value to be the candidate center $x_0$ 212.

As stated above, according to Equation (3), the method obtains circle radiuses $r_1$ and $r_2$ 210, calculated from P1, P2 and Q1, Q2 separately and respectively. The method verifies whether the two radiuses $r_1$ and $r_2$ are equal 214. If foreign structures, such as long lines, exist inside and outside the circle simultaneously, it is possible that the two radiuses $r_1$ and $r_2$ are not equal. This is because one or more edge points may not be real or true. However, if only one of the four edge points is not detected accurately, the other three edge points can still be used to calculate the correct circle parameters 216.

If two or more edge points are not detected correctly, a Hough transform based approach can be used.

Compared with the conventional Hough transform and other circle detection methods, the present invention has the following advantages:

A method according to the present invention has high computational speed, typically the method does not conduct a Hough transform. The computational speed is faster than the conventional Hough transform and other circle detection approaches. Running on a 200 MHz computer, the average execution time of the circle detection method is about 15 µs.

A method according to the present invention uses less memory, the present method does not conduct a transform, computations are focused on scanning several lines in the ROI, therefore, less memory is needed.

A method according to the present invention has high parameter resolution, the present method uses a method that obtains circle parameters without discretization.

A method according to the present invention, since there are two scanning modes in the present invention, it can be extended to detect a ring. It can also be used to verify whether two circles have the same center.

An important processing step for BGA model generation is the determination of the number of balls in the horizontal and vertical directions. By selecting a suitable threshold value, the number of balls in a row/column can be determined by counting the number of peaks, local maximum, in a projection space as shown in FIG. 1. The threshold value for determining the number of balls can be empirically selected according to normal illumination conditions for BGA components. Under normal illumination, the contrast between the foreground and the background will be high so that an object can be easily recognized. However, under lesser illumination conditions, the contrast between the foreground and the background will be low, therefore, it can be difficult a foreground object, such as balls in a ball grid array.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and micro instruction code. The various processes and functions described herein may either be part of the micro instruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

Figure 3A:
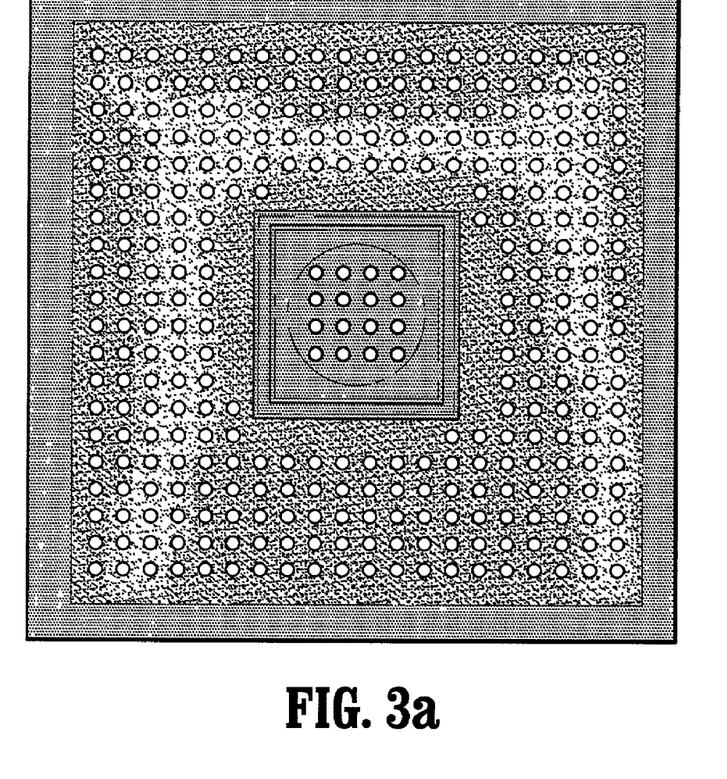
FIG. 3a is an image of a ball grid array according to another embodiment of the present invention.
Figure 3B:
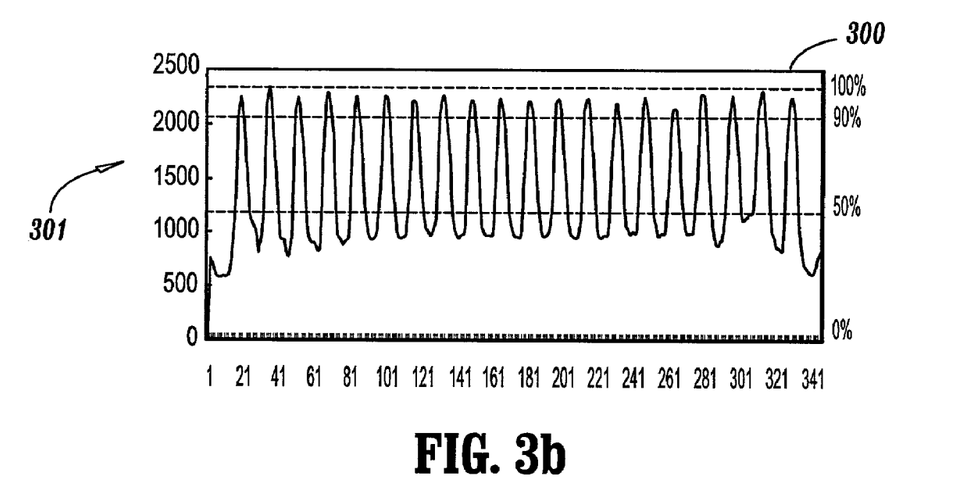
FIG. 3b is a projection profile of a row of a ball grid array of FIG. 3a, according to an embodiment of the present invention.

Referring to FIGS. 3*a*–3 *b*, if a threshold value is selected within a given range 301 between [1200, 2100] in the projection space 300, a number of peaks can be determined correctly. However, one or more peaks may be miss-counted if the threshold value is selected outside of the mentioned range. Since the absolute value of a threshold is sensitive to illumination conditions, a relative value (percentage) of the maximum value can be used for determining a suitable threshold. In the case illustrated in FIG. 3*b*, the suitable range for the relative threshold selection is between 50% and 90%. Therefore, under normal illumination conditions, the threshold value for determining the number of peaks in a projection space can be set between 50% and 90%. This threshold can be set empirically, for example, to 80%, which may be suitable for BGA modeling applications under normal illumination conditions.

Figure 4:
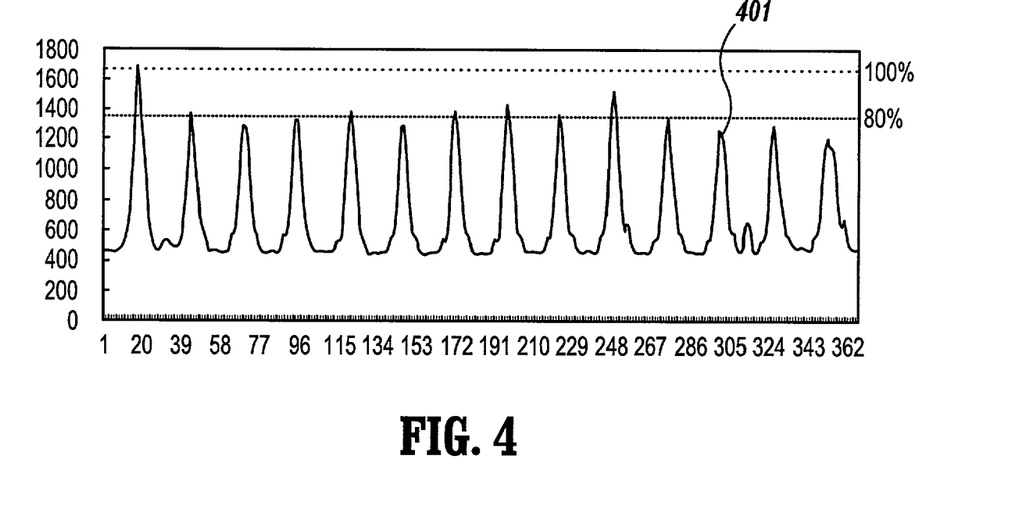
FIG. 4 is a projection profile of a row of a ball grid array according to an embodiment of the present invention.

In some illumination cases, for example, the lighting makes the contrast between a foreground object, e.g., balls, and the background objects, e.g., circuit paths, so low that the ball detection can fail, however, an empirically set threshold may not be appropriate. For example, as shown in FIG. 4, the empirically set threshold of 80% fails to determine at least seven peaks, e.g., 401. In general, threshold values can depend on multiple factors, such as illumination conditions and BGA component surface properties. Therefore, according to an embodiment of the present invention, an adaptive method is described for a large range of illumination conditions and BGA component surface properties.

As shown in FIG. 4, a projection profile can be obtained from the vertical projection of the first row BGA balls or circles from a BGA component. It can be difficult to select an appropriate threshold value to determine the correct number of peaks. In the case of the BGA projection profile illustrated in FIG. 5, if the threshold value of 80% is selected, several peaks will be missing. A method according to an embodiment of the present invention can improve the robustness of a BGA modeling method.

One property of BGA components is that the distance between any two adjacent balls in a row or column is identical to the distance between any other two adjacent balls. This property can be called the equal inter-ball distance property. This property can be used to determine a number of balls in a projection array.

Figure 6:
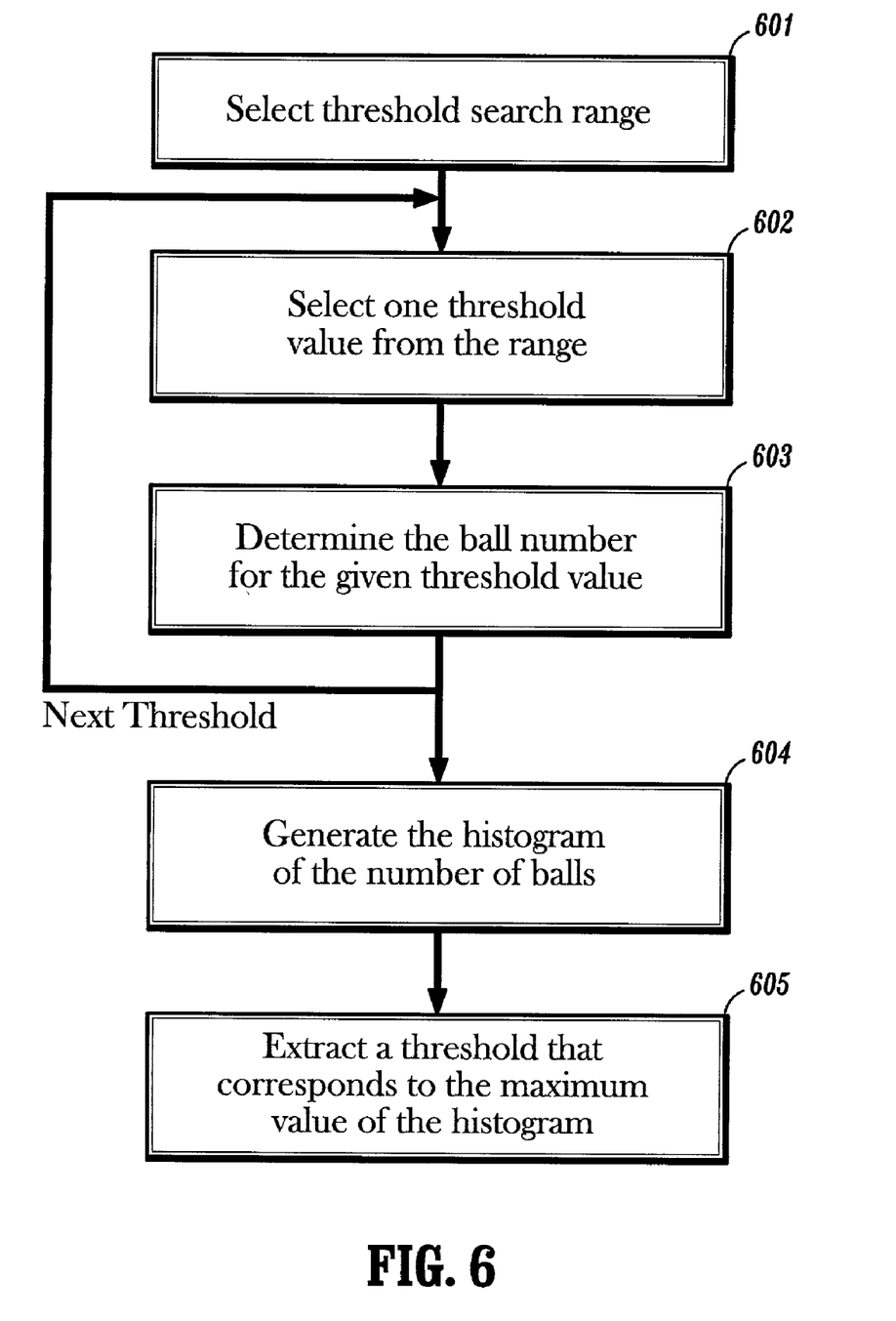
FIG. 6 is a flow chart of a method of determining an object in an image according to an embodiment of the present invention.

The adaptive threshold determination method is related to a majority-voting scheme. An appropriate threshold value is determined by searching the possible threshold values from a given threshold range based on the equal inter-ball distance property of BGA components. A flow diagram of an adaptive threshold determination method is shown in FIG. 6 (described in detail below).

Figure 5:
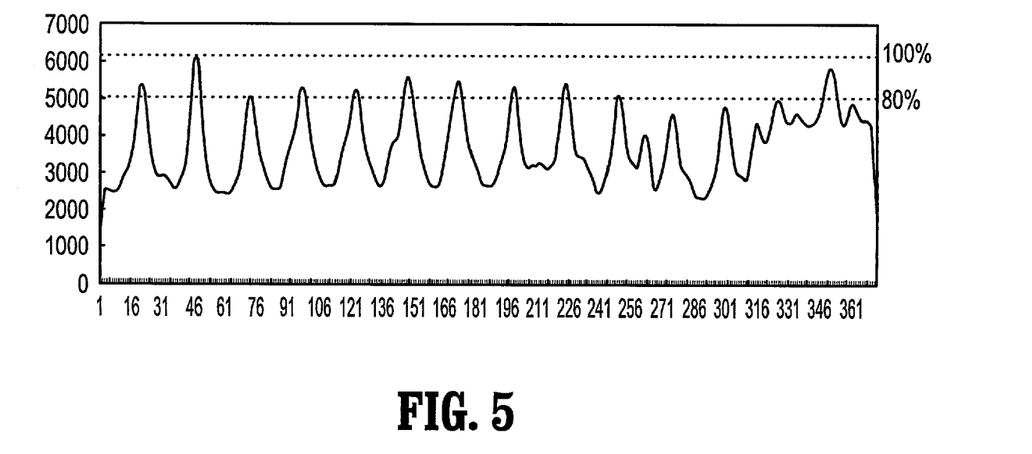
FIG. 5 is a projection profile of a row of a ball grid array according to an embodiment of the present invention.

Given a threshold value, the number of peaks (local maximum) can be determined in a projection space. One method of determining a peak is to look for sequences of projection values that follow a peak-like pattern. However, due to the illumination variations and environmental noise, a determined peak may not correspond to the center of a BGA ball. For example, the projection profile shown in FIG. 7 has fourteen balls (peaks), as shown in FIG. 5, in the projection space. However, if threshold value of 80% is selected, only nine peaks (local maximum) can be determined. If 70% is selected, sixteen peaks are determined. In order to determine the correct number of balls from the number of peaks, a method for determining the number of balls in the projection space uses the equal inter-ball distance property.

A method for determining the ball number in the projection space determines a row/column of ball projection array by projecting a row/column of ball image horizontally or vertically. The method determines a local maximum (peaks) from the projection space for a given threshold. The method determines the distances between adjacent peaks at the given threshold. The distances can be stored in a distance array. An inter-peak histogram of the distances can be determined. The inter-peak distance bin width is $\partial$, which is the tolerance of the equal distance. The inter-ball distance that has the maximum value of the inter-peak distance histogram can be determined. The method detects the positions of the first ball and the last ball, which may or may not be the first or last peak. The method verifies the position of the first ball and the last ball based on the equal inter-ball distance criteria. The number of balls (N), can be determined by a method according to:

$$N = \frac{\text{distance between the first and the last ball}}{\text{inter-ball distance}} + 1$$

where the inter-ball distance is determined according to a maximum value of the inter-peak distance histogram.

According to an embodiment of the present invention, the number of balls in the projection array can be determined. For example, if the threshold percentage (T) is set to 70%, sixteen peaks can be determined from the projection array shown in FIG. 7. The positions of peaks are shown in Table 1. In addition, the distance between two adjacent peaks can be determined.

Figure 8:
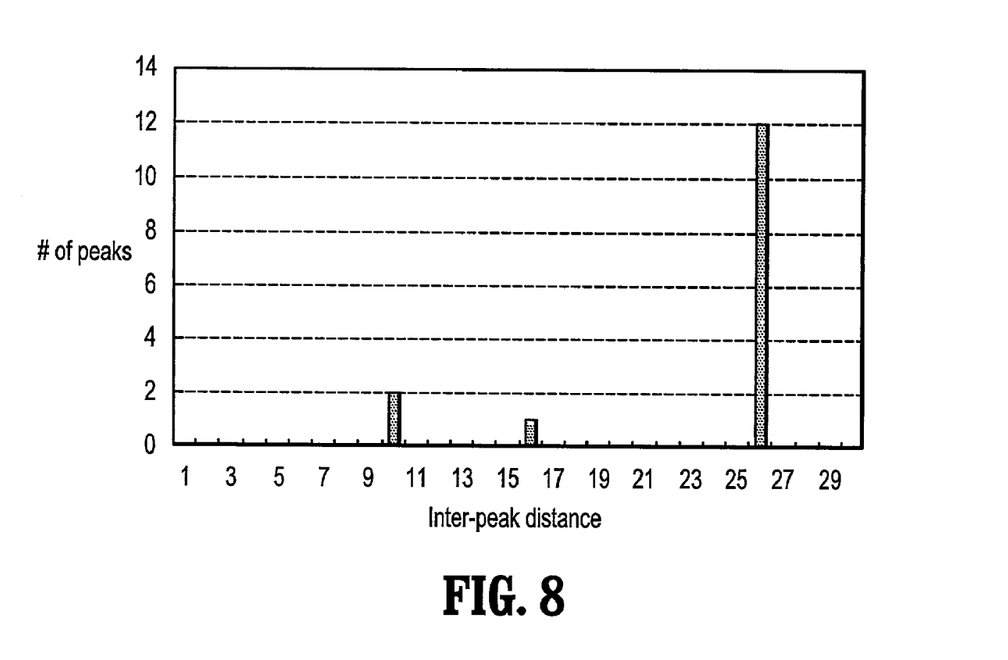
FIG. 8 is a histogram of an inter-ball distance according to an embodiment of the present invention.

The histogram plot of the inter-peak distance is shown in FIG. 8. According to FIG. 8, the histogram bin width $\partial$ is two, which is the tolerance of the equal inter-ball distance. Therefore, the inter-ball distance can be determined to be 25.33, which is the average of all inter-ball distances located in the 25–26 bin of the histogram plot. Also, from Table 1, the positions of the first ball and the last ball can be determined based on the equal inter-ball distance criteria, which are located at 20 (peak one) and 350 (peak fifteen), respectively. Peak sixteen (360) is not considered to be the last ball since the distance between peak fifteen and peak sixteen is not substantially equal to the inter-ball distance. The number of balls in the projection space can then be determined according to:

$$\frac{\text{Distance between the first and the last ball}}{\text{inter-ball distance}} + 1 = \frac{350 - 20}{25.33}$$
$$= 14.03$$
$$\approx 14$$

For a given threshold, a method can determine a number of balls in the projection space. However, some threshold values may still lead to an incorrect number of balls. Therefore, an adaptive threshold determination method is implemented to determine a threshold value within a given threshold value range. Referring to FIG. 6, a method for adaptive threshold determining determines a threshold search range 601 and selects a threshold value from the range 602. The method determines a ball number for each threshold of the threshold range 603. The method determines a histogram of the number of balls for each threshold percentage 604. The method determines a threshold that corresponds to a maximum value of the histogram 605.

Figure 7:
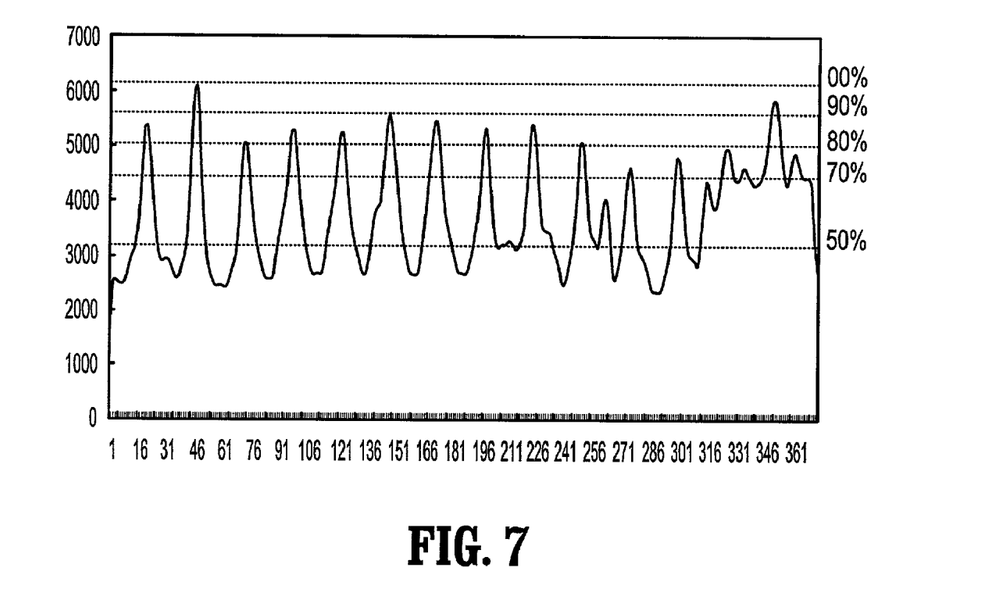
FIG. 7 is an adaptive projection profile according to an embodiment of the present invention.
Figure 9:
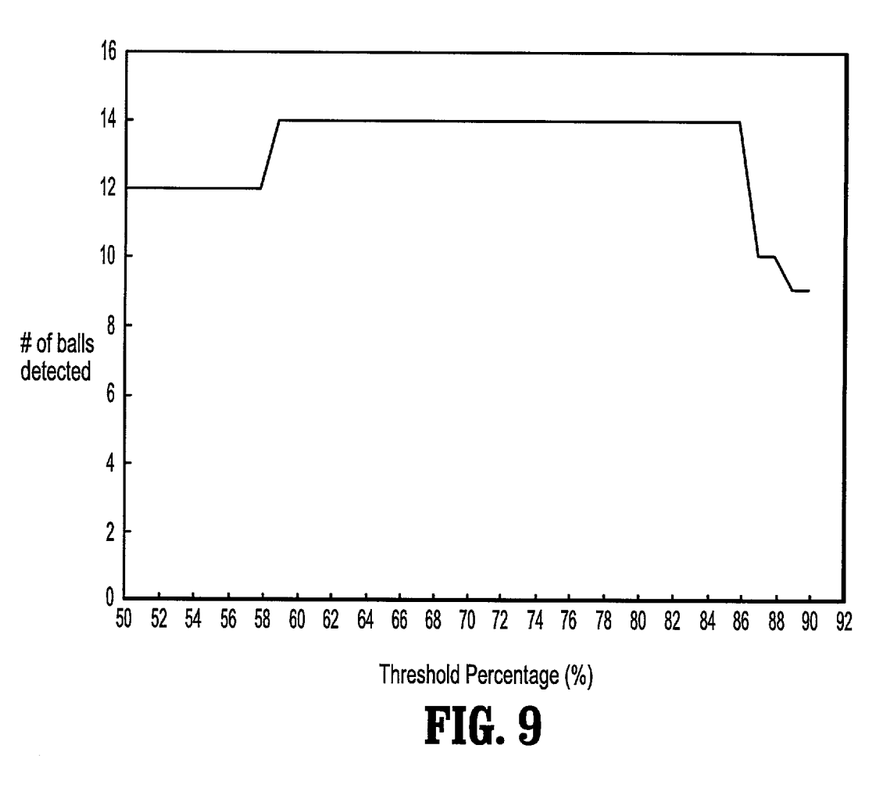
FIG. 9 is a profile of a number of balls according to an embodiment of the present invention.

In the example discussed with reference to FIG. 7, given any threshold value in this range, the number of balls in the projection space can be determined. FIG. 9 shows the profile of the number of balls for the threshold values varying from 50% to 90%. The histogram plot of the number of balls is shown in FIG. 10.

Figure 10:
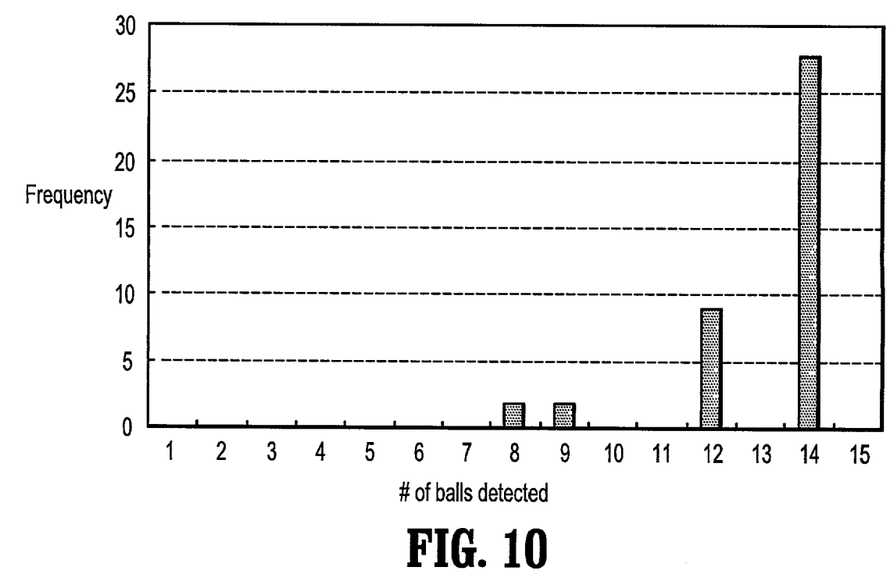
FIG. 10 is a histogram of a number of balls according to an embodiment of the present invention.

From FIG. 10, the largest frequency of the number of balls detected is fourteen. Thus, a method according to an embodiment of the present invention determines the number of balls in the projection to be fourteen. From FIG. 9, the optimal threshold value range corresponding to the number of balls can be determined to be [59%, 85%]. This means that the number of balls can be determined correctly by any given threshold value within this optimal threshold value range. The middle of this optimal range, which is 72, can be determined to be the optimal threshold value that is used for the model generation for this BGA component.

The described adaptive threshold determination method can enhance the robustness of BGA modeling software. An adaptive threshold determination method can further be applied to other industrial object modeling and inspection applications, such as SMD lead modeling and detection. In the SMD lead modeling and detection application, the number of leads can also be determined using a threshold. Therefore, the proposed adaptive threshold determination method can also make a lead modeling and detection method more robust. Furthermore, this method represents a new way of determining the optimal threshold based on a majority-voting scheme, which can make many common threshold based machine vision methods more robust.

Having described embodiments for a method of adaptive threshold determination for BGA component modeling, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for determining a number of balls in a projection space comprising the steps of:
    determining a projection of a portion of a ball grid array;
    determining at least one local maximum of the projection space for a given threshold;
    determining a distance between adjacent maximum;
    determining an inter-peak histogram of the distances;
    determining an inter-ball distance for each pair of adjacent balls that has the maximum value of the inter-peak distance histogram corresponding to the pair of adjacent balls;

determining a position of a first ball and a position of a last ball;

verifying the position of the first ball and the position of the last ball based on a general inter-ball distance; and determining the number of balls.

2. The method of claim 1, wherein the step of determining the projection further comprises the step of projecting a row or column of an image of the balls in a direction, wherein the direction is one of horizontal and vertical.

3. The method of claim 1, wherein an inter-peak distance bin width is a tolerance of the general inter-ball distance.

4. The method of claim 1, wherein the number of balls is determined according to:

$$N = \frac{\text{distance between the first and the last ball}}{\text{inter-ball distance}} + 1$$

where N is the number of balls and the inter-ball distance is determined according to a maximum value of the inter-peak distance histogram.

5. The method of claim 1, wherein the given threshold is an adaptive threshold.

6. The method of claim 5, further comprising determining the adaptive threshold, comprising the steps of:

determining a preliminary number of balls in the projection space for one or more threshold values in a threshold searching range based on the general inter-ball distance of ball grid array components;

determining a histogram for the preliminary number of balls;

determining a threshold range comprising a plurality of threshold values, wherein each threshold value corresponds to a maximum number of balls at the threshold value; and setting the adaptive threshold to one of a mean threshold value and a median threshold value of the threshold range.

7. The method of claim 6, wherein the histogram shows a maximum frequency of the number of balls.

8. The method of claim 1, wherein the general inter-ball distance is an average of the distances between each pair of adjacent balls.

9. A program storage device readable by machine, tangibly embodying a program of instructions executable by the machine to perform method steps for determining a number of balls in a projection space, the method steps comprising:

determining a projection of a portion of a ball grid array;

determining at least one local maximum of the projection space for a given threshold;

determining a distance between adjacent maximum;

determining an inter-peak histogram of the distances;

determining an inter-ball distance for each pair of adjacent balls that has the maximum value of the inter-peak distance histogram corresponding to the pair of adjacent balls;

determining a position of a first ball and a position of a last ball;

verifying the position of the first ball and the position of the last ball based on a general inter-ball distance; and determining the number of balls.

10. The method of claim 9, wherein the step of determining the projection further comprises the step of projecting a row or column of an image of the balls in a direction, wherein the direction is one of horizontal and vertical.

11. The method of claim 9, wherein an inter-peak distance bin width is a tolerance of the general inter-ball distance.

12. The method of claim 9, wherein the number of balls is determined according to:

$$N = \frac{\text{distance between the first and the last ball}}{\text{inter-ball distance}} + 1$$

where N is the number of balls and the inter-ball distance is determined according to a maximum value of the inter-peak distance histogram.

13. The method of claim 9, wherein the given threshold is an adaptive threshold.

14. The method of claim 13, further comprising determining the adaptive threshold, comprising the steps of:

determining a preliminary number of balls in the projection space for one or more threshold values in a threshold searching range based on the general inter-ball distance of ball grid array components;

determining a histogram for the preliminary number of balls;

determining a threshold range comprising a plurality of threshold values, wherein each threshold value corresponds to a maximum number of balls at the threshold value; and setting the adaptive threshold to one of a mean threshold value and a median threshold value of the threshold range.

15. The method of claim 14, wherein the histogram shows a maximum frequency of the number of balls.

16. The method of claim 9, wherein the general inter-ball distance is an average of the distances between each pair of adjacent balls.

* * * * *